United States Patent
Chene

(10) Patent No.: US 8,356,272 B2
(45) Date of Patent: Jan. 15, 2013

(54) LOGIC VERIFICATION MODULE APPARATUS TO SERVE AS A HYPER PROTOTYPE FOR DEBUGGING AN ELECTRONIC DESIGN THAT EXCEEDS THE CAPACITY OF A SINGLE FPGA

(75) Inventor: Mon-Ren Chene, Cupertino, CA (US)

(73) Assignee: S2C Inc., San Jose, CA (US)

( * ) Notice: Subject to any disclaimer, the term of this patent is extended or adjusted under 35 U.S.C. 154(b) by 0 days.

(21) Appl. No.: 13/161,061

(22) Filed: Jun. 15, 2011

(65) Prior Publication Data

US 2012/0290993 A1   Nov. 15, 2012

Related U.S. Application Data

(60) Provisional application No. 61/485,177, filed on May 12, 2011.

(51) Int. Cl.
*G06F 11/22* (2006.01)
*G06F 17/50* (2006.01)

(52) U.S. Cl. .......................... 716/136; 716/106; 716/111

(58) Field of Classification Search ................... 716/106, 716/111, 136
See application file for complete search history.

(56) References Cited

U.S. PATENT DOCUMENTS

2006/0184350 A1* 8/2006 Huang et al. .................... 703/26
2009/0300568 A1* 12/2009 Kuroda .......................... 716/10

* cited by examiner

*Primary Examiner* — Vuthe Siek
*Assistant Examiner* — Brian Ngo
(74) *Attorney, Agent, or Firm* — Patentry

(57) ABSTRACT

A apparatus and a system and method to operate the above provide a reconfigurable platform for emulating and debugging a user design which exceeds the capacity of a single field programmable logic device (FPGA). The method and system facilitates design and emulation of a system-on-a-chip type user design. The netlist of a user design may be included with logic value tunneling circuits in an emulation using a platform including a number of field programmable devices. A verification module apparatus provides a hyper prototype for debugging an electronic design that exceeds the capacity of a single FPGA. A verification module provides access to a plurality of attached FPGAs by means of Logic Value Tunneling Transmitters and Receivers which deliver many signals over few pins.

4 Claims, 4 Drawing Sheets

LOGIC VERIFICATION MODULE APPARATUS TO SERVE AS A HYPER PROTOTYPE FOR DEBUGGING AN ELECTRONIC DESIGN THAT EXCEEDS THE CAPACITY OF A SINGLE FPGA

RELATED PATENTS AND APPLICATIONS

This application claims the benefit of provisional patent application Ser. No. 61/485,177 submitted on 12 May 2011 by the present inventors, which is incorporated by reference. Priority is claimed from the above provisional application. A related patent is U.S. Pat. No. 7,353,162 "Scalable reconfigurable prototyping system and method."

BACKGROUND

1. Field of the Invention

The present invention relates to automation and validation techniques for designing electronic circuits. In particular, the present invention relates to automation and validation techniques for designing electronic circuits that are particularly applicable to system-on-a-chip type electronic circuits.

2. Description of the Related Art

It is conventional to use field programmable gate array (FPGA) devices from vendors such as Xilinx and Altera to prototype application specific integrated circuits implemented as masked gate arrays or standard cells. However the limitation of pins is a barrier to debugging an incorrect design. Individual FPGAs may have their observability enhanced by embedding Logic Analyzer intellectual property but at a cost of routing and logic resources which negatively impacts the amount of user logic that can easily be placed and routed automatically. A single FPGA being debugged may be attached to a host computer for control and display. It is awkward for two FPGAs to work together and be attached to separate host computers.

It is known that Field Programmable Gate Arrays (FPGA) are used for prototyping large electronic circuits and that tools and methodologies exist for debugging the signals on any one FPGA. These tools require substantial routing and logic resources of each FPGA which are not available for the prototype.

A problem exists where debugging a complex electronic circuit requires a plurality of FPGA. While it is possible to emulate each FPGA of a prototype which requires multiple FPGAs, it is extremely difficult to understand problems which cross the boundaries of one FPGA to another FPGA. It is known that the single chip FPGA debugging solution does not scale.

A first generation system controls an FPGA compiler to deliver signals which are to be observed, to the external pins. But input and output pins are frequently the bounding resource in FPGAs and functional blocks may not fit at all into an FPGA with reduced pins.

A second generation system embeds a simple internal logic analyzer to trigger off a simple logic equation and deliver on a small sequence of events. Multiple instances of this internal logic analyzer were required to be useful and functionality was thinner than desired.

A third generation system combines a plurality of FPGAs but only allows one of the FPGAs to be probed. This could only debug problems that luckily originated in one part of the design. It was unable to deal with problems that spanned the FPGA partitioning.

A conventional FPGA debugging tool is restricted to the signals within a single FPGA and consumes resources which reduce the amount of user logic that may be implemented within the single FPGA. This makes place and route of the user logic more difficult because both pin, logic elements, and channels are consumed by the debugging circuit.

Here are the conventional steps in the design flow:
1. Conventional: Set up user design
   1a. Perform initial design entry
   1b. Perform synthesis and place-and-route
   1c. Program the single device and test
2. Conventional: Set up conventional embedded logic analyzer
   2a. Create file of signals desired for observability
   2b. Select signals for analysis
   2c. Setup signals, triggers, conditional triggers, hierarchical triggers
3. Conventional: Capturing, Displaying, and Analyzing Sample Signal Values
   3a. Re-program the single device and test
   3b. Displaying the sampled signal values on attached host computer
   3c. Analyzing data to identify problems in the user design.

Thus it can be appreciated that what is needed is a way to debug a "system on a chip" which occupies, in its prototype form, a plurality of FPGAs. In particular, the problem being solved is to trigger logic value capture as a result of a combination of signal sequences internally used among a plurality of FPGAs.

SUMMARY OF AN EXEMPLARY EMBODIMENT OF THE INVENTION

The present invention provides a method and a system using a reconfigurable platform for designing and emulating a user design. A logic verification module and interface to a host computer is compiled into an FPGA. The signals to be traced by the logic verification module reside within an other FPGA. A logic value tunneling circuit is compiled into each FPGA to enable the logic verification module to trigger on and capture logic values internal to an other FPGA. The present invention may be implemented on a platform including memories and a number of field programmable logic devices, such as programmable gate arrays.

According to one embodiment of the present invention, using the system for emulating and debugging the user design, a user generates a top-level module including the user design. The user then synthesizes and partitions the user design into partitions each suitable for implementing in one of the programmable logic devices. In addition, each programmable logic device is assigned a data value tunnel. Through the data value tunnel, each partition may be fully visible to the logic analyzer implemented in a programmable logic device on the verification module. The partitions and the data value tunnel circuits are then placed and routed and implemented in the programmable logic devices.

According to one embodiment of the present invention, the system may provide a system debugging tool for monitoring and analyzing signals in and between the programmable logic devices during run time. The system debugger tool may include an FPGA read back tool, a data value tunnel, and an internal logic analyzer tool. The internal logic analyzer tool comprises a programmable logic device configured as a circuit implementing a logic analyzer.

BRIEF DESCRIPTION OF THE DRAWINGS

In order that the manner in which the above-recited and other advantages and features of the invention are obtained, a more particular description of the invention briefly described above will be rendered by reference to specific embodiments thereof which are illustrated in the appended drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION OF EMBODIMENTS OF THE INVENTION

Reference will now be made to the drawings to describe various aspects of exemplary embodiments of the invention. It should be understood that the drawings are diagrammatic and schematic representations of such embodiments and, accordingly, are not limiting of the scope of the present invention, nor are the drawings necessarily drawn to scale.

Figure 1:
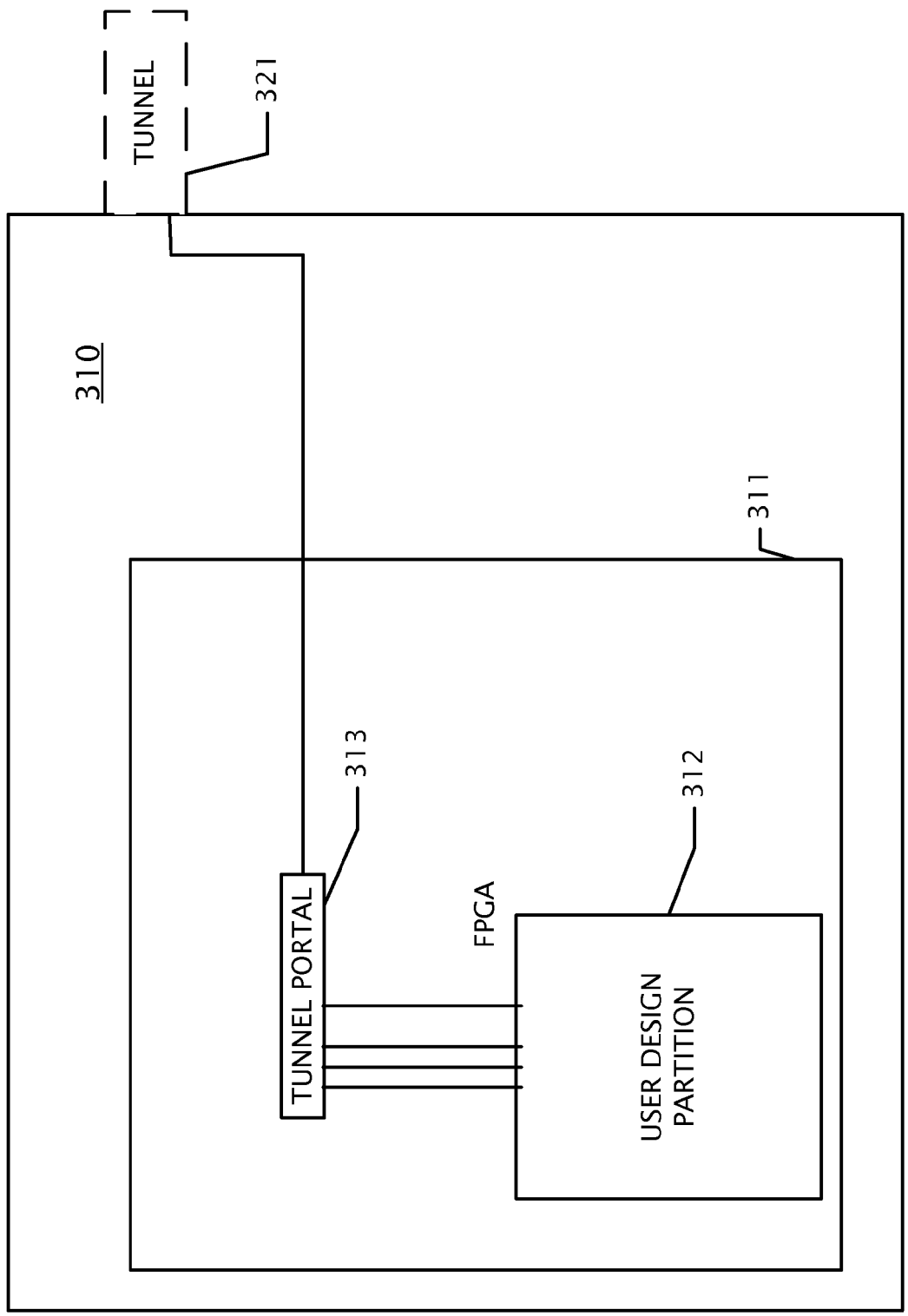
FIG. 1 is a block diagram of an SOC partition logic module.

Accordingly, referring to FIG. 1, in an embodiment an FPGA 311 is a component of a SOC partition logic module which is coupled to other modules by a tunnel 321. The FPGA is configured to contain a user design partition 312 and a tunnel portal 313 which accesses circuit signal values and transfers to and from the tunnel.

Figure 2:
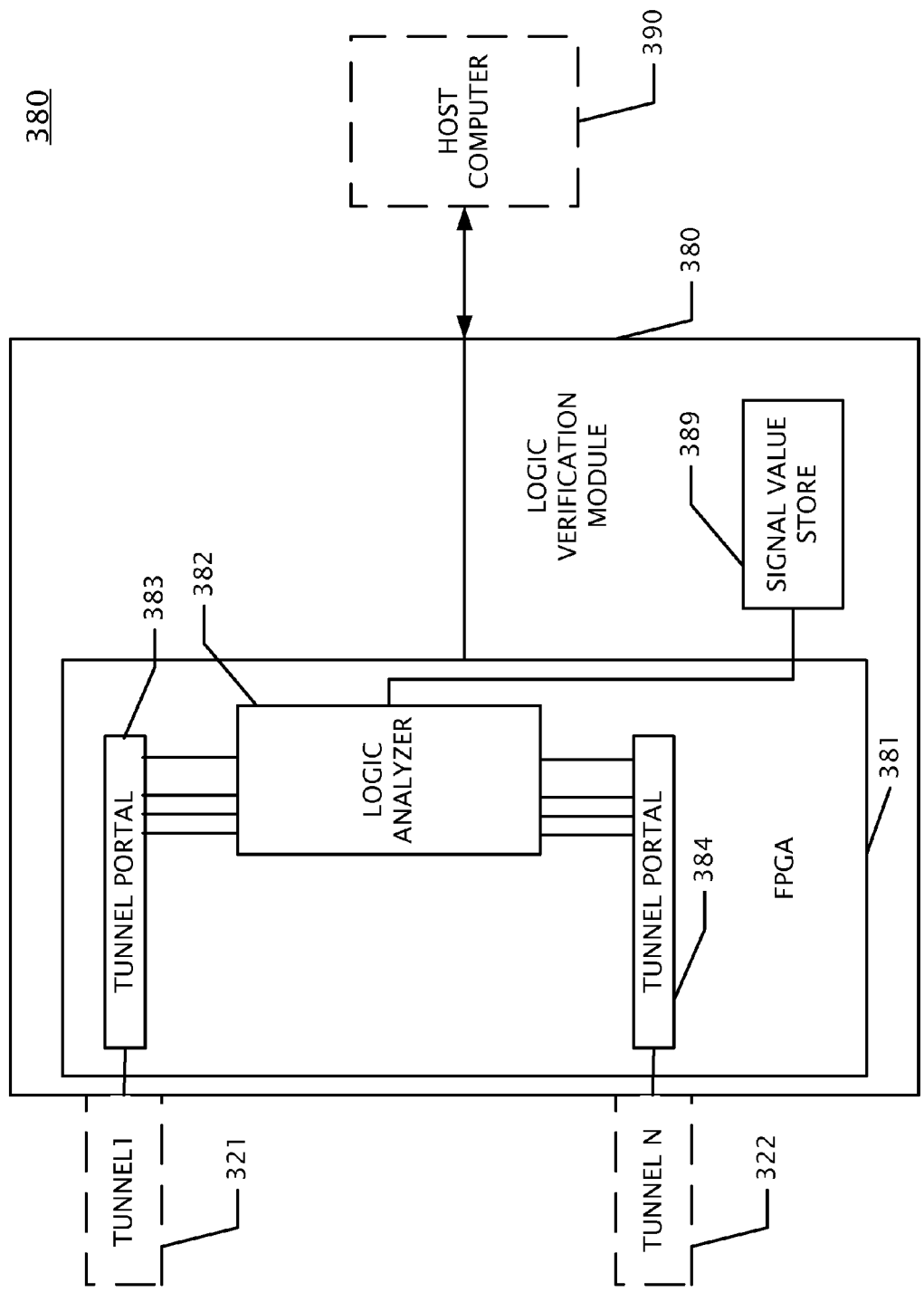
FIG. 2 is a block diagram of a logic verification module.

In an embodiment, referring now to FIG. 2, the invention comprises a logic verification module 380 which is coupled to a host computer 390, and also is coupled to a plurality of SOC partition logic modules through tunnels 321 322. In an embodiment the logic verification module contains a signal value store 389. The logic verification module comprises an FPGA 381 which is configured to contain a logic analyzer 382, and at least one tunnel portal 383 384. Each tunnel portal is coupled to a tunnel.

Figure 3:
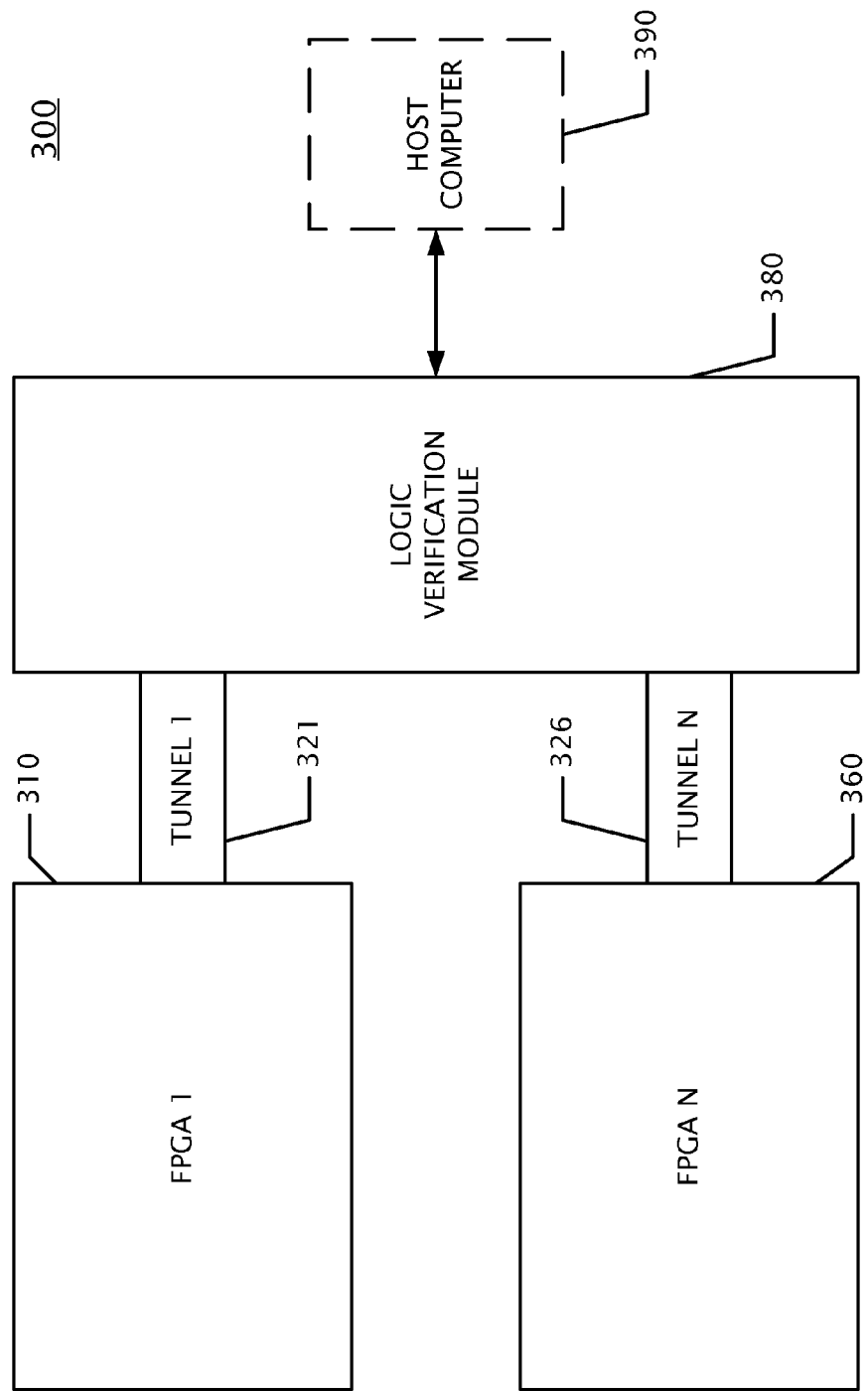
FIG. 3 is a system schematic combining both modules.

Referring to FIG. 3 a schematic, in an embodiment, a system 300 comprises a plurality of FPGA's 310 360 coupled through tunnels 321 326 to a logic verification module 380 which is in turn coupled to a host computer 390. The advantage of the tunnels is that it overcomes the limitation of the number of pins available to transfer signals to the logic analyzer within the logic verification module 380.

Figure 4:
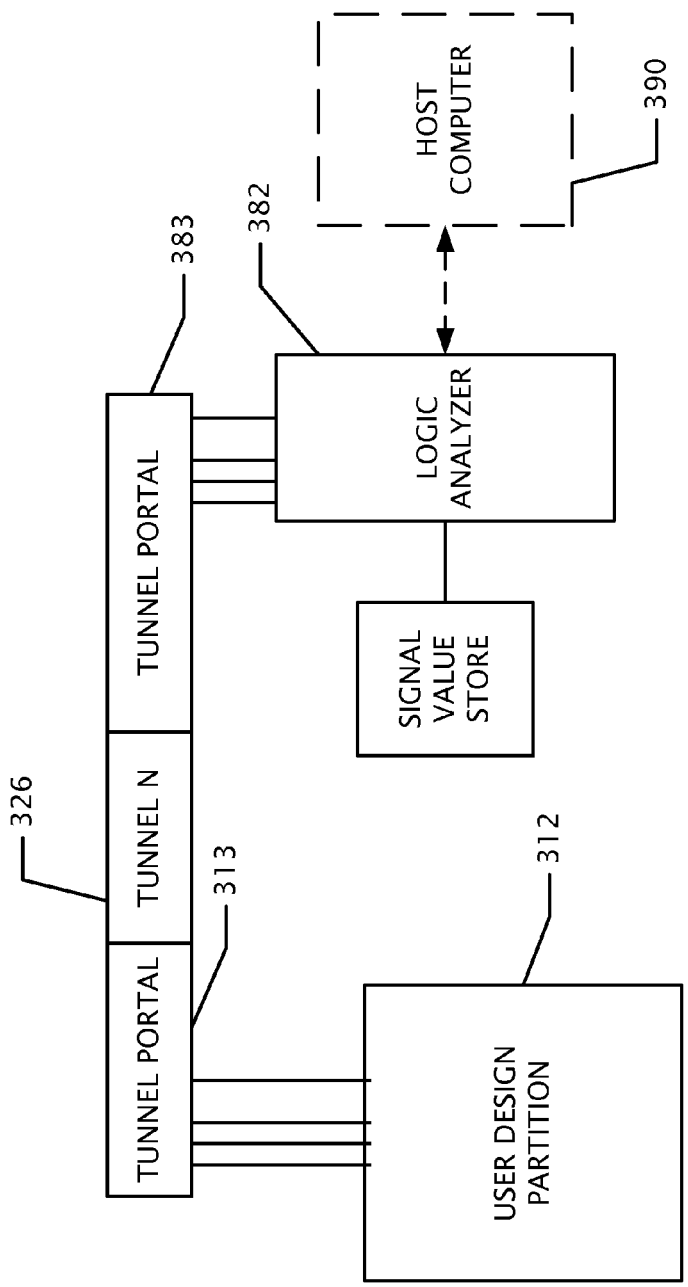
FIG. 4 is a block diagram of an apparatus which combines both modules on a single printed circuit board.

It can be appreciated that a single printed circuit board can provide both an FPGA configured as a user design partition and a logic analyzer as illustrated in FIG. 4. Host computer 390 provides a graphical user interface to a human user for controlling the operations of electronically reconfigurable prototyping system 400. Through the graphical user interface, a user of host computer 390 may access a user design, select signals for observability, and set triggers for data capture and view the results following emulation. Host computer 390 may be implemented by an engineering workstation or a personal computer. In this embodiment, host computer 390 communicates with the logic analyzer 382 through an industry standard communication interface, which may be implemented, for example, by a USB, PCI, IEEE-1394 ("firewire") or another industry standard bus.

One aspect of the invention is an apparatus which comprises a plurality of Field Programmable Gate Array Devices (FPGA) communicatively coupled and affixed to a printed circuit board(pcb). The pcb has an interface to a user workstation. At least one of the FPGA is configured as an conventional embedded logic analyzer IP circuit description; and at least one first clock and user signal compression tunnel portal;

at least one other field programmable logic devices is configured for emulating the whole or part of a user design wherein each field programmable logic device is assigned, in addition to the user design, a circuit for a user signal compression tunnel through which a portion of the user design assigned to the programmable logic device communicates with portions of the user design assigned to other programmable logic devices; and at least one second clock and user signal compression tunnel portal which is communicatively coupled to the embedded logic analyzer IP circuit.

In another embodiment, the invention is a logic verification module coupled to at least one SOC partition logic module which holds the user logic as described below:

A Logic Verification Module is coupled to a plurality of prototyping boards each comprising input output circuits and an FPGA. The Logic Verification Module has an FPGA with no user logic at all and contains Logic Value Tunnel circuits to each prototyping board. In an embodiment the Logic Verification Module further contains storage circuits and an interface circuit to a host computer which controls operation and displays the results.

The Logic Verification Module contains circuits to observe, trigger on, and store logic values which are in other FPGAs. But a shortage of pins creates a bottleneck.

One solution is sharing FPGA pins for a large number of output probes by controlling a multiplexor to switch between desired probe points.

An other solution is using LVDS drivers and receivers to increase the data rate between FPGAs and deliver logic values in multiple bit words.

An other solution is using SERDES technology to change parallel buses to serial within the FPGA.

An other solution is to store bits into each M4k bit buffer and transmit them during idle time or between cycles.

The present invention may be embodied in a method for operating an apparatus:

selecting on a checkbox on a graphical user interface that probing is desired for a specified register transfer language description of an electronic circuit;

extracting signal names from said RTL description;

specifying the signal names desired for observability by selecting from a hierarchical directory of module interfaces and internal signals;

partitioning the electronic circuit among a plurality of FPGAs;

maintaining a cross index of internal RTL signal names and signals between FPGAs;

inserting logic value portals and logic analysis circuits into the design description;

initiating a synthesis of the RTL to a gate level netlist which keeps selected signal names externally observable;

assigning signals to pins of the respective FPGAs and routing between FPGAs; and placing and routing each FPGA.

Here are the improved steps in the preferred embodiment of the improved design flow:

1. Conventional: Set up user design
  1a. Perform initial design entry
  1b. Perform synthesis and place-and-route
  1c. Program the single device and test
2. Improvement: Set up multi-chip access method for debugging prototype
  2a. Create file of signals desired for observability 2a+i Improvement: Partition user design and conventional embedded logic analyzer among a plurality of chips.
2a+ii Perform synthesis and place-and-route each FPGA
2b. Select signals for analysis
2b+iii Improvement: Determine optimized tunnel compression technology
2c. Setup signals, triggers, conditional triggers, hierarchical triggers
2c+iv Improvement: Insert a Compression Tunnel Portal image into each programming file.
2c+v Improvement: Insert storage input/output management image into each programming file.
3. Improvement: Capturing, Displaying, and Analyzing Sample Signal Values from multi-chip prototype
3a. Re-program the single device and test
3a+vi Improvement: Program a plurality of devices and test
3a+vii Improvement: Writing signal values to off-chip storage
3a+viii Improvement: Comparing new signal values with stored signal values
3a+ix Improvement: Transferring off-chip storage addresses of signal values (and only signal values not previously transferred)
3a+x Improvement: Reading signal values from off-chip storage
3b. Displaying the sampled signal values on attached host computer
3c. Analyzing data to identify problems in the user design.

One aspect of the present invention may be appreciated as a system for designing and emulating a user design. This system has, in part:
(i) a verification module and system controller comprising:
(a) an interface to a user workstation;
(b) at least one field programmable logic device configured as an conventional embedded logic analyzer IP circuit description; and
(c) at least one first clock and user signal compression tunnel portal.

But the verification module contains no user design logic. The design has been partitioned to partition logic modules. The system presents as:
(ii) at least one SoC partition logic module coupled to a clock and user signal value compression tunnel, each logic module comprising:
(d) a plurality of field programmable logic devices for emulating the user design wherein each field programmable logic device is assigned, in addition to the user design, a circuit for a user signal compression tunnel through which a portion of the user design assigned to the programmable logic device communicates with portions of the user design assigned to other programmable logic devices; and
(e) at least one second clock and user signal compression tunnel portal. The advantage is that partitioning across several FPGAs which do not have logic analyzer IP allows easier place and route. Previously, place and route resources needed for the logic analyzer reduced the size of the user design which could be debugged.

In an embodiment, the clock and user signal compression tunnel portal contains:
SerDes functional blocks.

In an embodiment, the clock and user signal compression tunnel portal contains:
an LVDS interface circuit.

In an embodiment, the clock and user signal compression tunnel portal contains:
at least one signal multiplexor circuit.

In an embodiment, the clock and user signal compression tunnel portal contains:
a controller for clock signals.

To avoid being limited to one vendor, the present patent application utilizes the terms field programmable logic device and field programmable gate array and their equivalents interchangeably.

In an embodiment, the verification module further incorporates:
off-chip storage, said storage communicatively coupled to a field programmable logic device containing an embedded logic analyzer. This means that signal values volumes much larger than the internal storage of the programmable logic devices can be stored. And that the addresses of the storage can be used to further compress data transfer in a non-linear way.

The verification module further has:
an off-chip storage input/output management circuit to deal with writing to and reading from memory devices on the board.

If these stored signal values are interesting to the user, it is transferred by a circuit to read signal values from off-chip storage and to transfer signal values to a user workstation where they can be viewed, compared, and analyzed.

An apparatus designed to transfer data values efficiently could include a circuit (or a processor configured by instructions) to determine that the same data values were previously stored into a memory and to determine the address. This utilizes a circuit to transfer a storage address when a signal value has been or will be stored in off-chip storage at said address.

Another aspect of the invention is a method for functionally evaluating a user design, including:
(i) providing a verification module and system controller comprising:
(a) an interface to a user workstation;
(b) at least one field programmable logic device configured as an conventional embedded logic analyzer IP circuit description; and
(c) at least one first clock and user signal compression tunnel portal. The portals connect the verification module to all the FPGAs which have the signals of interest for verification. The method also includes
(ii) providing at least one SoC partition logic module coupled to a clock and user signal value compression tunnel. Each logic module has:
(d) a plurality of field programmable logic devices for emulating the user design; and
(e) at least one second clock and user signal compression tunnel portal.

The method further includes:
(iii) generating a top-level module including the user design and one or more embedded logic analyzer IP circuit descriptions;
(iv) partitioning the user design into partitions, each partition suitable for configuration into one of the programmable logic devices; and
(v) assigning to each programmable logic device at least one signal value compression tunnel through which the partition to be configured in that programmable logic device is allowed communication with other partitions configured in other programmable logic devices. These steps or processes are automated using computers to transform many large files from many original files into fewer intermediate files and then transform them again to match the resources available in a plurality of FPGAs. There can be no simple human way to transform the source files to the binary images in the programming files which control the circuit path within an FPGA.

The partitioning process breaks up the design into partitions of the user design, each partition being intended for implementation in a single FPGA. In one embodiment, the partition command invokes a third party partition tool. Because of the interconnection scheme using the data value tunneling described below, a partition tool can optimize partitioning according to an objective of maximizing the utilization of FPGA capacity, without being constrained by FPGA pin usage. The partitioner generates a separate netlist for each FPGA. Partitioning preserves all design information and functions of the user design. Alternatively, third party partitioners or manual partition may be used to partition the design. The partitioner may allow constraints to be specified, which guide the partitioner to generate a netlist that targets the intended hardware.

After executing a partitioning process on the user design, the compiler invokes place and route processes to operate on the netlist of each FPGA. The place and route processes are typically FPGA vendor-specific programs that translate each netlist into a file of a binary format or an ASCII format. The output file can be down-loaded then into the FPGAs. In one embodiment, the place and route processes are run on more than one user station or processor to allow the FPGA place and route tasks to run in parallel. The place and route binary or ASCII output files may be stored in host computer 390 for further runtime software processing.

The verification module is dedicated to IPs implementing an internal logic analyzer ("Internal Logic Analyzer IP") or a flow/state analyzer. These IPs allow a system designer to debug the configured system at runtime. For example, an Internal Logic analyzer IP may be used at specified trigger points to sampling the values of signals in the user design and store them to memory elements for subsequent analysis. Runtime software may access and manipulate these Debug IPs at runtime.

The internal logic analyzer tool sets trigger conditions in a logic analyzer embedded in the verification module. The logic analyzer is a specialized IP ("Logic Analyzer IP") down-loaded into the Verification Module. The Logic Analyzer IP may be provided the same functions as a conventional logic analyzer. The Logic Analyzer IP can provide samples of a large number of signals and handles a large number of trigger conditions. In one embodiment, the internal logic analyzer tool sets trigger conditions at the embedded Logic Analyzer IP, waits for a trigger condition or event to happen, reads the signal sample data from embedded sample memory of the Logic Analyzer IP, and associates the sample data with user defined symbols. In one embodiment, the internal logic analyzer tool sets a complicated event state machine embedded in the Logic Analyzer IP. The event state machine operates according to a user defined sequence of conditions to sample signal data for a debugging purpose. The Logic Analyzer IP gives user the ability to monitor signals at run time conditions (e.g., an in-circuit mode operation rather than halting or suspending execution).

The present invention is distinguished by a process for setting up a multi-chip access method for debugging a prototype across chip boundaries.

To begin with, a process executes on user selections in a graphical display to create a file of signals desired for observability.

The next step in the method is partitioning the top level module so that one or more embedded logic analyzer IP circuit descriptions are partitioned to the verification module whereby the interface to the user workstation provides one or more triggers and transmits signal values captured upon observation of each trigger.

Then the method, as expected, performs placing and routing each partition to an image file with spare resources suitable for configuring one of the programmable logic devices.

The present invention is distinguished by the two following steps:
a) selecting signals for analysis and
b) determining optimum tunnel compression technology. The number of signals required for analysis has a direct effect on choosing the tunnel compression technology to meet the bandwidth requirement of triggering on and capturing the signal values in the user design.

Once the technology is chosen to forward signal values from the emulation FPGA to the logic analyzer FPGA, it becomes useful to
a) set up observable signals, triggers, conditional triggers, and hierarchical triggers; and
b) insert at least one Compression Tunnel Portal image into each said image file with spare resources suitable for implementing in one of the programmable logic devices. The portal controls the complex operation of pins to send data across to the verification module.

In an embodiment, the programming file is transformed by inserting an off-chip storage input/output management image into the image file which contains the embedded logic analyzer IP file on the verification module.

After generating the necessary programming files by analyzing and transforming the circuit description language files into image files, the process invokes the automated implementing of the placed and routed image files in the programmable logic devices.

In an embodiment, the computer-implemented method further executes instructions controlling circuits to perform:
a) writing signal values to off-chip storage,
b) comparing new signal values to stored signal values,
c) transferring addresses of off-chip stored values when they match,
d) transferring an address and signal values when not matched to previously stored signal values, and
e) reading signal values from off-chip storage.

All of the method steps are further transformed into computer readable instructions and stored into and read from a non-transitory medium.

Means, Embodiments, and Structures

Embodiments of the present invention may be practiced with various computer system configurations including handheld devices, microprocessor systems, microprocessor-based or programmable consumer electronics, minicomputers, mainframe computers and the like. The invention can also be practiced in distributed computing environments where tasks are performed by remote processing devices that are linked through a network.

With the above embodiments in mind, it should be understood that the invention can employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated.

Any of the operations described herein that form part of the invention are useful machine operations. The invention also relates to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

The invention can also be embodied as computer readable code on a non-transitory computer readable medium. The computer readable medium is any data storage device that can store data, which can thereafter be read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network-coupled computer system so that the computer readable code is stored and executed in a distributed fashion. Within this application, references to a computer readable medium mean any of well-known non-transitory tangible media.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the claims.

CONCLUSION

The present invention can be easily distinguished from conventional ASIC prototyping solutions by:
  i. a compact and efficient transfer of logic signal values between user logic in an FPGA and logic analyzer IP in another FPGA;
  ii. visibility of the hierarchical RTL signal names at the host computer without knowledge of which FPGA contains the actual signal trace; and
  iii. less duplication of logic analyser IP within multiple FPGA systems and the resulting easier place and route.

What is claimed is:

1. A method including in part computer readable instructions stored into and read from a non-transitory medium, for functionally evaluating a user design by using a computer, comprising:
  (i) providing a verification module and system controller comprising:
    (a) an interface to a user workstation;
    (b) at least one field programmable logic device configured as an conventional embedded logic analyzer IP circuit description; and
    (c) at least one first clock and user signal compression tunnel portal;
  (ii) providing at least one SoC partition logic module coupled to a clock and user signal value compression tunnel, each logic module comprising:
    (a) a plurality of field programmable logic devices for emulating the user design; and
    (b) at least one second clock and user signal compression tunnel portal;
  (iii) generating a top-level module including the user design and one or more embedded logic analyzer IP circuit descriptions by using said computer;
  (iv) partitioning the user design into partitions, each partition suitable for configuration into in one of the programmable logic devices by using said computer;
  (v) assigning to each programmable logic device at least one signal value compression tunnel through which the partition to be configured in that programmable logic device is allowed communication with other partitions configured in other programmable logic devices by using said computer;
  (vi) placing and routing each partition to an image file with spare resources suitable for configuring one of the programmable logic devices by using said computer;
  (vii) selecting signals for analysis;
  (viii) determining optimum tunnel compression technology by using said computer;
  (ix) setting up observable signals, triggers, conditional triggers, and hierarchical triggers; and
  (x) inserting at least one Compression Tunnel Portal image into each said image file with spare resources suitable for implementing in one of the programmable logic devices.

2. A method as in claim 1 further comprising:
inserting an off-chip storage input/output management image for signal value compression into the image file which contains the embedded logic analyzer IP file on the verification module.

3. A method as in claim 1 further comprising:
implementing the placed and routed image files in the programmable logic devices.

4. A method as in claim 2 further comprising:
a) writing signal values to off-chip storage,
b) comparing new signal values to stored signal values,
c) transferring addresses of off-chip stored values when they match,
d) transferring an address and signal values when not matched to previously stored signal values, and
e) reading signal values from off-chip storage.

* * * * *